US009857390B2

(12) United States Patent
Takizawa

(10) Patent No.: US 9,857,390 B2
(45) Date of Patent: Jan. 2, 2018

(54) PHYSICAL QUANTITY SENSOR, ELECTRONIC DEVICE, AND MOBILE BODY

(71) Applicant: Seiko Epson Corporation, Tokyo (JP)

(72) Inventor: Teruo Takizawa, Matsumoto (JP)

(73) Assignee: Seiko Epson Corporation (JP)

( * ) Notice: Subject to any disclaimer, the term of this patent is extended or adjusted under 35 U.S.C. 154(b) by 223 days.

(21) Appl. No.: 14/819,756

(22) Filed: Aug. 6, 2015

(65) Prior Publication Data

US 2016/0061853 A1 Mar. 3, 2016

(30) Foreign Application Priority Data

Aug. 27, 2014 (JP) .................................. 2014-172675

(51) Int. Cl.
*G01C 19/56* (2012.01)
*G01P 1/02* (2006.01)
*G01C 19/5747* (2012.01)
*G01C 19/5712* (2012.01)
*G01C 19/5719* (2012.01)
(Continued)

(52) U.S. Cl.
CPC .................. *G01P 1/02* (2013.01); *B81B 7/02* (2013.01); *G01C 19/5712* (2013.01); *G01C 19/5719* (2013.01); *G01C 19/5747* (2013.01); *G01C 19/5783* (2013.01); *G01D 11/245* (2013.01); *G01P 1/023* (2013.01); *B81B 2201/0235* (2013.01); *B81B 2201/0242* (2013.01); *B81C 2203/0109* (2013.01); *B81C 2203/0145* (2013.01); *B81C 2203/031* (2013.01)

(58) Field of Classification Search
CPC ........ G01P 1/02; G01P 1/023; G01P 15/0802; G01P 15/125; G01P 15/097; G01C 19/5783; G01C 19/5719; G01C 19/5769; G01C 19/5712; G01C 19/5747; B81B 7/007; B81B 7/02; B81B 7/0038; B81B 7/0041
See application file for complete search history.

(56) References Cited

U.S. PATENT DOCUMENTS 5,365,790 A * 11/1994 Chen .................... G01L 9/0042
29/25.41
5,837,562 A * 11/1998 Cho ........................ G01P 1/023
257/E21.499
(Continued)

FOREIGN PATENT DOCUMENTS

| JP | 2006-201022 A | 8/2006 |
|---|---|---|
| JP | 2007-047069 A | 2/2007 |

(Continued)

*Primary Examiner* — Helen Kwok
(74) *Attorney, Agent, or Firm* — Harness, Dickey & Pierce, P.L.C.

(57) ABSTRACT

A physical quantity sensor has a package, which is provided with a substrate and a lid and has an internal space inside, and a functional element which is accommodated in the internal space, the lid is formed on a partition wall section which is provided on the periphery of the internal space in planar view and has a communication hole which causes a lower surface at the substrate side to communicate with an upper surface at the opposite side to the substrate, and the communication hole communicates with the internal space via a groove which is formed in the substrate.

20 Claims, 11 Drawing Sheets

(51) Int. Cl.
 *G01D 11/24* (2006.01)
 *B81B 7/02* (2006.01)
 *G01C 19/5783* (2012.01)

(56) References Cited

U.S. PATENT DOCUMENTS

| | | | | |
|---|---|---|---|---|
| 6,416,831 B1 * | 7/2002 | Hara | ..................... | B81B 7/0077 |
| | | | | 206/524.8 |
| 6,924,165 B2 * | 8/2005 | Horning | .............. | B81C 1/00301 |
| | | | | 438/48 |
| 6,926,592 B2 * | 8/2005 | Brandes | ..................... | B24C 1/04 |
| | | | | 451/53 |
| 7,004,025 B2 * | 2/2006 | Tamura | ................. | B81B 7/0041 |
| | | | | 73/504.14 |
| 7,662,653 B2 * | 2/2010 | O'Brien | ................... | B81B 7/007 |
| | | | | 257/E21.499 |
| 8,633,049 B2 * | 1/2014 | Nasiri | ................. | B81C 1/00238 |
| | | | | 257/E21.499 |
| 8,978,472 B2 | 3/2015 | Takizawa | | |
| 9,038,463 B2 | 5/2015 | Takizawa | | |
| 9,392,694 B2 * | 7/2016 | Naruse | .................... | G01P 1/023 |
| 2006/0063462 A1 * | 3/2006 | Ding | ........................ | B81B 7/007 |
| | | | | 445/25 |
| 2012/0049299 A1 * | 3/2012 | Chou | .................. | B81C 1/00246 |
| | | | | 257/417 |
| 2012/0142144 A1 * | 6/2012 | Taheri | ..................... | B81B 7/007 |
| | | | | 438/107 |
| 2013/0265701 A1 | 10/2013 | Takizawa | | |
| 2014/0130595 A1 * | 5/2014 | Zhao | ......................... | B81B 7/02 |
| | | | | 73/495 |

FOREIGN PATENT DOCUMENTS

| | | |
|---|---|---|
| JP | 2008-091417 A | 4/2008 |
| JP | 2013-069858 A | 4/2013 |
| JP | 2013-079868 A | 5/2013 |
| JP | 2013-096952 A | 5/2013 |
| JP | 2013-101031 A | 5/2013 |
| JP | 2013-102036 A | 5/2013 |
| JP | 2013-232626 A | 11/2013 |
| JP | 2015-004517 A | 1/2015 |

* cited by examiner

PHYSICAL QUANTITY SENSOR, ELECTRONIC DEVICE, AND MOBILE BODY

BACKGROUND

1. Technical Field

The present invention relates to a physical quantity sensor, an electronic device, and a mobile body.

2. Related Art

For example, in JP-A-2013-102036, a physical quantity sensor is disclosed which has a package that has a substrate and a lid, and a functional element which is accommodated in an internal space that is formed inside the package. In addition, a hole section for sealing, which causes the inside of the internal space to communicate with the outside of the internal space, is formed in the lid, and after the internal space is set to a predetermined atmosphere via the hole section, it is possible to maintain the internal space at the predetermined atmosphere by sealing the hole section. However, in the physical quantity sensor in JP-A-2013-102036, mechanical strength in the vicinity of the hole section of the lid is reduced since the configuration of the hole section is complicated, and the hole section is formed such that the upper surface of the lid communicates with the ceiling of the internal space. For this reason, in particular, there is an increased concern that cracks are generated at the periphery of the hole section of the lid and the lid is damaged due to contraction accompanying heat damage or cooling of a sealing material when the hole section is sealed using the sealing material. When the lid is damaged, airtightness of the internal space is reduced, and it is not possible to maintain the internal space in the predetermined atmosphere. Furthermore, the hole section of the lid is included in the internal space, and there are certain restrictions on the arrangement relationship of the hole section and the internal space.

SUMMARY

An advantage of some aspects of the invention is to provide a physical quantity sensor, an electronic device, and a mobile body which exhibit high mechanical strength.

The invention can be realized in the following application examples.

APPLICATION EXAMPLE 1

According to this application example, there is provided a physical quantity sensor including: a substrate; a first concave section which is formed on the substrate; a lid which is fixed to the substrate; a second concave section which is formed on the lid; a cavity which is formed from the first concave section and the second concave section; a functional element which is accommodated in the cavity; a communication hole which is formed in the lid and does not communicate with the second concave section; and a groove which is formed in the substrate and communicates with the first concave section, in which the communication hole communicates with the cavity via the groove.

Thereby, a physical quantity sensor exhibiting high mechanical strength is obtained.

APPLICATION EXAMPLE 2

In the physical quantity sensor according to the application example, it is preferable that a sealing material is disposed inside the communication hole, and the atmosphere of the functional element is sealed.

Thereby, it is possible to seal the functional element in a predetermined atmosphere.

APPLICATION EXAMPLE 3

In the physical quantity sensor according to the application example, it is preferable that the communication hole has a portion in which a cross-sectional area tapers from a first surface side toward a second surface side.

Thereby, it is easy to retain the sealing material in a solid form in the middle of the communication hole, and it is possible to more effectively hermetically seal the cavity.

APPLICATION EXAMPLE 4

In the physical quantity sensor according to the application example, it is preferable that the lid has a concave section which is open at the second surface, the substrate has a concave section which is open at the surface of the lid side, the openings of the two concave sections communicate with each other to form the cavity, and in planar view, the communication hole is disposed at a position where at least the opening of the first surface side is shifted to the concave section of the lid.

Thereby, the configuration of the physical quantity sensor is easy.

APPLICATION EXAMPLE 5

In the physical quantity sensor according to the application example, it is preferable that in planar view, the communication hole is disposed such that a portion of the opening of the second surface side overlaps with the concave section of the lid.

Thereby, it is possible to achieve a reduction in size of the physical quantity sensor.

APPLICATION EXAMPLE 6

In the physical quantity sensor according to the application example, it is preferable that the groove is open at the surface on the lid side on the substrate.

Thereby, the configuration of the groove is simplified.

APPLICATION EXAMPLE 7

In the physical quantity sensor according to the application example, it is preferable that the depth of the groove is shallower than the concave section on the substrate.

Thereby, it is possible to reduce the cross-sectional area of the groove, and it becomes difficult for splash, which is generated when the sealing material is melted, to infiltrate inside the cavity.

APPLICATION EXAMPLE 8

In the physical quantity sensor according to the application example, it is preferable that the width of the groove is wider than the opening on the first surface side of the communication hole.

Thereby, even if the position of the lid is shifted somewhat with respect to the base, it is possible to connect the communication hole and the groove.

APPLICATION EXAMPLE 9

In the physical quantity sensor according to the application example, it is preferable that the groove includes at least one of a bent section and a curved section between the communication hole and the cavity.

Thereby, it becomes difficult for splash, which is generated when the sealing material is melted, to infiltrate inside the cavity.

APPLICATION EXAMPLE 10

In the physical quantity sensor according to the application example, it is preferable that the groove is connected to the communication hole in the middle in the extension direction.

Thereby, it becomes difficult for splash, which is generated when the sealing material is melted, to infiltrate inside the cavity.

APPLICATION EXAMPLE 11

In the physical quantity sensor according to the application example, it is preferable that the groove is a liquid reservoir.

Thereby, it becomes difficult for splash, which is generated when the sealing material is melted, to infiltrate inside the cavity.

APPLICATION EXAMPLE 12

In the physical quantity sensor according to the application example, it is preferable that the cavity has a first cavity and a second cavity, the functional element has a first functional element which is accommodated in the first cavity, and a second functional element which is accommodated in the second cavity, the communication hole has a first communication hole which is formed in a partition wall section that is provided on the periphery of the first cavity, and a second communication hole which is formed in a partition wall section that is provided on the periphery of the second cavity, and the groove has a first groove which causes the first communication hole to communicate with the first cavity, and a second groove which causes the second communication hole to communicate with the second cavity.

Thereby, it is possible to seal the first cavity and the second cavity under separate conditions.

APPLICATION EXAMPLE 13

In the physical quantity sensor according to the application example, it is preferable that the first functional element is an acceleration detection element, and the second functional element is an angular velocity detection element.

Thereby, a compound sensor is obtained which is able to detect acceleration and angular velocity.

APPLICATION EXAMPLE 14

According to this application example, there is provided an electronic device including the physical quantity sensor according to the application examples.

Thereby, an electronic device exhibiting high reliability is obtained.

APPLICATION EXAMPLE 15

According to this application example, there is provided a mobile body including the physical quantity sensor according to the application examples.

Thereby, a mobile body exhibiting high reliability is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
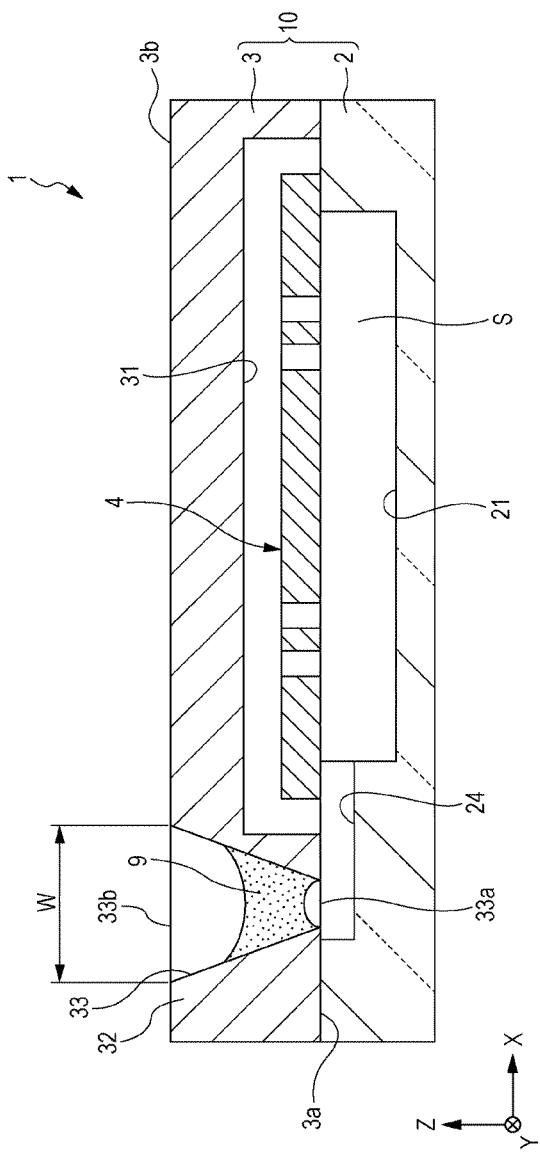
FIG. 1 is a sectional view of a physical quantity sensor according to a first embodiment of the invention.

A physical quantity sensor, an electronic device, and a mobile body of the invention will be described below in detail based on the embodiments which are illustrated in the drawings.

First Embodiment

Figure 2:
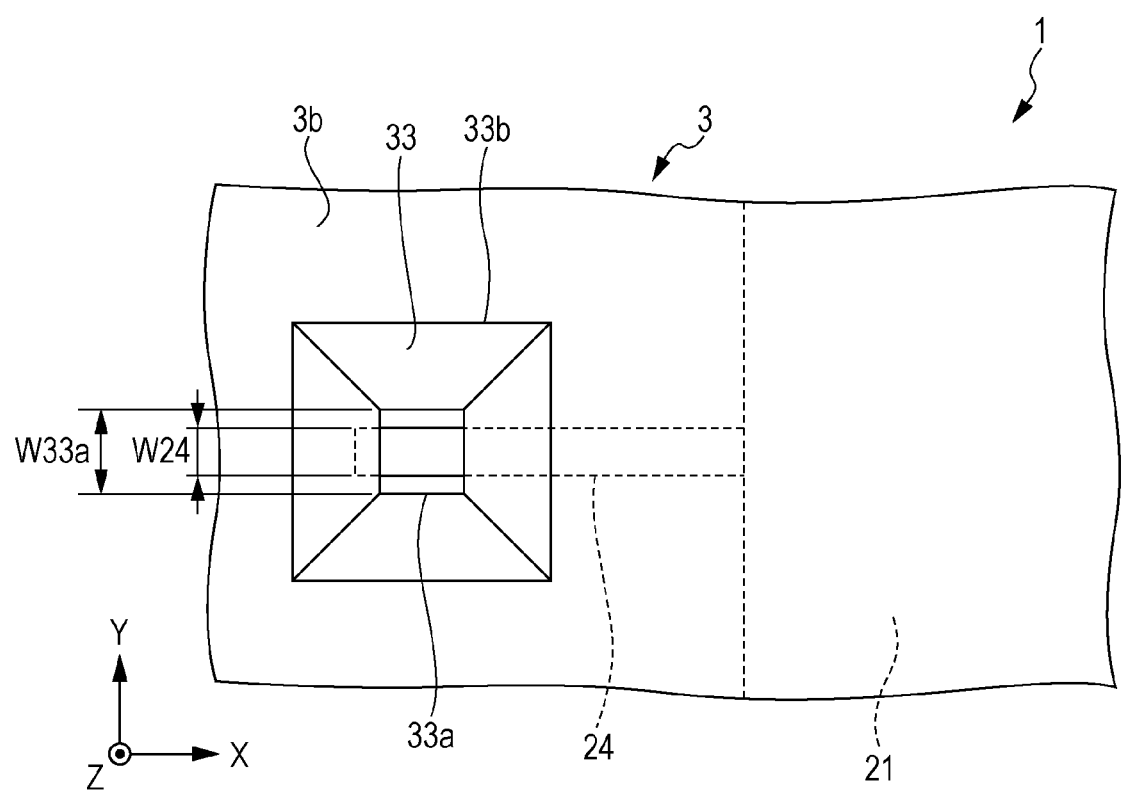
FIG. 2 is a planar view illustrating a communication hole which is included in the physical quantity sensor illustrated in FIG. 1.
Figure 3:
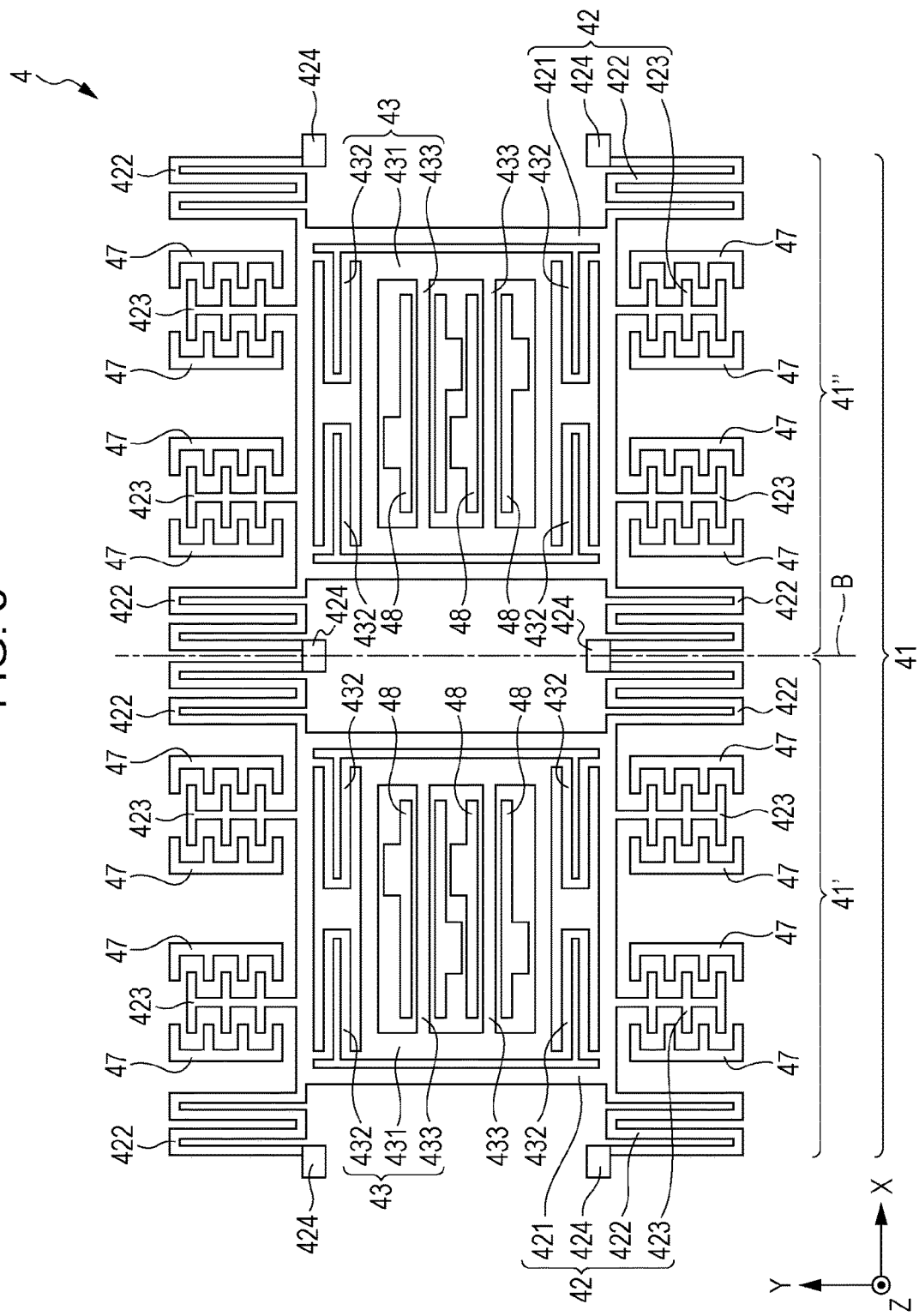
FIG. 3 is a planar view of a functional element which is included in the physical quantity sensor illustrated in FIG. 1.

FIG. 1 is a sectional view of the physical quantity sensor according to a first embodiment of the invention. FIG. 2 is a planar view illustrating a communication hole which is included in the physical quantity sensor illustrated in FIG. 1. FIG. 3 is a planar view of a functional element which is included in the physical quantity sensor illustrated in FIG. 1. Here, for convenience of explanation, the upper side is referred to as "upper" and the lower side is referred to as "lower" in FIG. 1. In addition, in each drawing, the X axis, the Y axis, and the Z axis are illustrated as three axes which are orthogonal to one another. In addition, hereinafter a direction which is parallel to the X axis is referred to as an "X axis direction", a direction which is parallel to the Y axis is referred to as a "Y axis direction", and a direction which is parallel to the Z axis is referred to as a "Z axis direction". In addition, a plane which includes the X axis and the Y axis is referred to as an "XY plane".

It is possible to utilize the physical quantity sensor 1 shown in FIG. 1 as an angular velocity sensor which is able to measure the angular velocity about the Z axis (vertical axis). Such a physical quantity sensor 1 includes a package 10 which has a substrate 2 and a lid 3, and a functional element 4 which is disposed in an internal space (cavity) S inside the package 10.

Substrate 2

A concave section (first concave section) 21 which is open at the upper surface is formed on the substrate 2. The functional element 4 is disposed above the concave section 21, and the functional element 4 and the substrate 2 are prevented from coming into contact by the concave section 21. In addition, a groove 24, which is open at the upper surface and is connected to the concave section 21 at one end section, is formed in the substrate 2. As will be described later, the groove 24 is a groove which causes a communication hole 33, which is formed in the lid 3, to communicate with the internal space S. In this manner, forming the groove 24 becomes easy due to the groove 24 being opened at the upper surface of the substrate 2. In addition, the groove 24 is formed so as to be shallower than the concave section 21. For example, with respect to the groove 24 having a depth of approximately 100 to 500 nm from the upper surface of the substrate 2, in the same manner, the concave section 21 has a depth of approximately 1 to 4 μm from the upper surface of the substrate 2.

Such a substrate 2 is formed from a glass material (for example, borosilicate glass such as Pyrex glass (registered trademark)) which includes alkali metal ions (movable ions). Thereby, it is possible to firmly join the functional element 4, which is formed from a silicon substrate, to the substrate 2 by anodic bonding. However, the configuration material of the substrate 2 is not limited to a glass material, and, for example, it is possible to use a high-resistance silicon material. In this case, it is possible to perform joining of the functional element 4 via, for example, a resin-based adhesive, a glass paste, a metal layer, or the like.

Lid 3

As shown in FIG. 1, the lid 3 has a concave section (second concave section) 31 which is open at a lower surface, and is joined to the substrate 2 such that the concave section 31 forms the internal space (cavity) S which accommodates the functional element 4 with the concave section 21. In addition, the lid 3 is formed in a partition wall section 32 which is positioned on the periphery of the concave section 31 (internal space S) in planar view, and has the communication hole 33 which causes a lower surface (first surface) 3a of the lid 3 to communicate with an upper surface (second surface) 3b of the lid 3. In other words, the lid 3 has the communication hole 33 which causes the lower surface to communicate with the upper surface and does not communicate with the concave section 31. Then, a lower side opening (an opening at the internal space S side) 33a of the communication hole 33 is positioned so as to overlap with the groove 24 of the substrate 2. For this reason, the communication hole 33 communicates with the internal space S via the groove 24. In addition, the communication hole 33 is sealed using a sealing material 9 which is formed of, for example, metal such as an Au—Ge alloy, and thereby, the internal space S is hermetically sealed. It is preferable that the internal space S come to be in a vacuum state (for example, a reduced pressure state of less than 10 Pa) in order to allow the functional element 4 to more effectively vibrate.

Here, a metal film or the like may be formed in order to increase adhesiveness of the sealing material 9 to the peripheral surface of the communication hole 33.

Such a lid 3 is, for example, formed using a silicon substrate. Thereby, it is possible to firmly join the lid 3 and the substrate 2 by anodic bonding.

According to such a configuration, in planar view, it is possible to join the periphery of the lower side opening 33a of the lid 3 to the substrate 2 since the lower side opening 33a of the communication hole 33 is disposed at a position which is shifted from the internal space S. For this reason, it is possible to enhance the mechanical strength of the periphery of the communication hole 33 of the lid 3, and damage to the lid 3 due to impacts such as falling is reduced. In addition, it is possible to reduce cracking which is generated in the vicinity of the communication hole 33 of the lid 3 and a decline in airtightness of the internal space S caused by heat which is generated when the sealing material 9 is melted by laser irradiation or the like, and stress which is generated by melting and solidification of the sealing material 9.

In particular, as described above, it is possible to sufficiently reduce the cross-sectional form of the groove 24 since the groove 24 which is formed in the substrate 2 is formed so as to be shallower than the concave section 21. For this reason, for example, it becomes difficult for splash, which is generated when the sealing material 9 is melted by laser irradiation, to infiltrate in the internal space S via the groove 24. Consequently, adhesion of metal splash to the functional element 4 is reduced, and it is possible to reduce functional decline of the functional element 4.

Next, the form and the disposition of the communication hole 33 will be described in detail. As shown in FIG. 1, the communication hole 33 has a tapered form in which a width W (the cross-sectional area) tapers from the upper side opening toward the lower side opening. By setting such a form, it is possible to melt the sealing material 9 (spherical prior to melting), which is disposed on an inclined surface of the communication hole 33, by laser irradiation, and it is possible to more effectively seal the communication hole 33. In addition, as shown in FIG. 1, in planar view, in the communication hole 33 a portion of an upper side opening 33b overlaps with the concave section 31. Thereby, degree of layout freedom of the communication hole 33 in planar view is increased with respect to the internal space S. That is, in comparison to JP-A-2013-102036 described above, it is possible to maximize the internal space S and a space of the functional element 4. Here, in the present embodiment, the planar form of the communication hole 33 is substantially rectangular, but the planar form of the communication hole 33 is not limited thereto, and may be, for example, circular.

In addition, as shown in FIG. 2, a width W33a of the lower side opening 33a of the communication hole 33 is wider than a width W24 of the groove 24. Thereby, for example, even if the position of the lid 3 is slightly shifted in the Y axis direction with respect to the substrate 2, it is possible to connect the whole region of the lower side opening 33a of the communication hole 33 to the groove 24. For this reason, it is possible to prevent a flow path in the middle (boundary section) of the groove 24, which becomes a flow path when the inside of internal space S is vacuumed, and the communication hole 33 becoming narrow, and it is possible to smoothly vacuum the inside of the internal space S via the groove 24 and the communication hole 33. However, the relationship between the width W33a and the width W24 is not limited thereto in the present embodiment, and the width W33a may be narrower than the width W24, or both may be equal.

Functional Element 4

The functional element 4 is an angular velocity sensor element for detecting angular velocity about the Z axis. As shown in FIG. 3, such a functional element 4 has a structure 41, a fixed electrode for driving 47, and a fixed electrode for detection 48. Such a functional element 4 is, for example, formed from a silicon substrate which is doped with impurities such as phosphorus and boron.

The structure 41 has two vibration bodies 41' and 41", and the vibration bodies 41' and 41" are connected to one another along the X axis direction. In addition, the vibration bodies 41' and 41" are provided symmetrically with respect to the respective boundary line B (straight line along the Y axis direction). The configurations of the vibration bodies 41' and 41" are described in detail below, but since the configurations of the vibration bodies 41' and 41" are the same as one another, hereinafter, the explanation of the configuration of the vibration body 41' is given as a representation and description of the configuration of the vibration body 41" is omitted.

As shown in FIG. 3, the vibration body 41' has a driving section 42 and a detecting section 43. In addition, the driving section 42 has a support section for driving 421, a spring section for driving 422, a movable electrode for driving 423, and a fixed section 424. The support section for driving 421 has a frame form, and is connected to the fixed section 424 which is fixed to the upper surface of the substrate 2 via the spring section for driving 422. The spring section for driving 422 is formed so as to be able to be elastically deformed in the X axis direction, and thereby, the support section for driving 421 becomes displaceable (able to be vibrated) in the X axis direction with respect to the fixed section 424. In addition, the movable electrode for driving 423 is connected to the support section for driving 421 and is positioned outside the support section for driving 421. Then, the fixed electrode for driving 47, which is fixed to the upper surface of the substrate 2, is positioned so as to face via the movable electrode for driving 423. For this reason, when a voltage is applied between the fixed electrode for driving 47 and the movable electrode for driving 423, electrostatic force is generated between the fixed electrode for driving 47 and the movable electrode for driving 423, and it is possible to cause the support section for driving 421 to vibrate along the X axis direction while the spring section for driving 422 is elastically deformed by the electrostatic force.

The detecting section 43 is disposed inside the support section for driving 421, and has a support section for detection 431, a spring section for detection 432, and a movable electrode for detection 433. The support section for detection 431 has a frame form, and is connected to the support section for driving 421 via the spring section for detection 432. The spring section for detection 432 is configured so as to be able to be elastically deformed in the Y axis direction, and thereby, the support section for detection 431 becomes displaceable in the Y axis direction with respect to the support section for driving 421. In addition, the movable electrode for detection 433 is provided so as to extend in the X axis direction inside the support section for detection 431, and both end sections of the movable electrode for detection 433 are connected to the to the support section for detection 431. Then, the fixed electrode for detection 48, which is fixed to the upper surface of the substrate 2, is positioned so as to face via the movable electrode for detection 433. For this reason, when the support section for detection 431 vibrates in the Y axis direction while the spring section for detection 432 is elastically deformed, a gap between the fixed electrode for detection 48 and the movable electrode for detection 433 changes, and accompanying this change, the electrostatic capacity between the fixed electrode for detection 48 and the movable electrode for detection 433 changes.

The configuration of the functional element 4 is described above. With such a configuration, it is possible for the functional element 4 to detect angular velocity about the Z axis as follows. First, as described above, the support section for driving 421 vibrates along the X axis direction by applying a voltage between the fixed electrode for driving 47 and the movable electrode for driving 423. At this time, the support sections for driving 421 of the vibration bodies 41' and 41" are caused to vibrate with reverse phases to one another (X axis reverse phase mode). In this manner, when an angular velocity W is applied to the functional element 4 about the Z axis in a state in which the support sections for driving 421 of the vibration bodies 41' and 41" are caused to vibrate, Coriolis force acts, and the support sections for detection 431 of the vibration bodies 41' and 41" are displaced in the Y axis direction with respect to the support sections for driving 421. Here, at this time, the support sections for detection 431 of the vibration bodies 41' and 41" are caused to vibrate with reverse phases to one another (Y axis reverse phase mode). In this manner, due to displacement of the support sections for detection 431 in the Y axis direction with respect to the support sections for driving 421, a gap between the movable electrode for detection 433 and the fixed electrode for detection 48 changes, and accompanying this gap change, the electrostatic capacity between the movable electrode for detection 433 and the fixed electrode for detection 48 changes. For this reason, the functional element 4 detects an amount of change of electrostatic capacity between the movable electrode for detection 433 and the fixed electrode for detection 48 by applying a voltage between the movable electrode for detection 433 and the fixed electrode for detection 48, and it is possible to determine the angular velocity ω about the Z axis based on the amount of change of electrostatic capacity.

Second Embodiment

Next, the second embodiment of a physical quantity sensor of the invention will be described.

Figure 4:
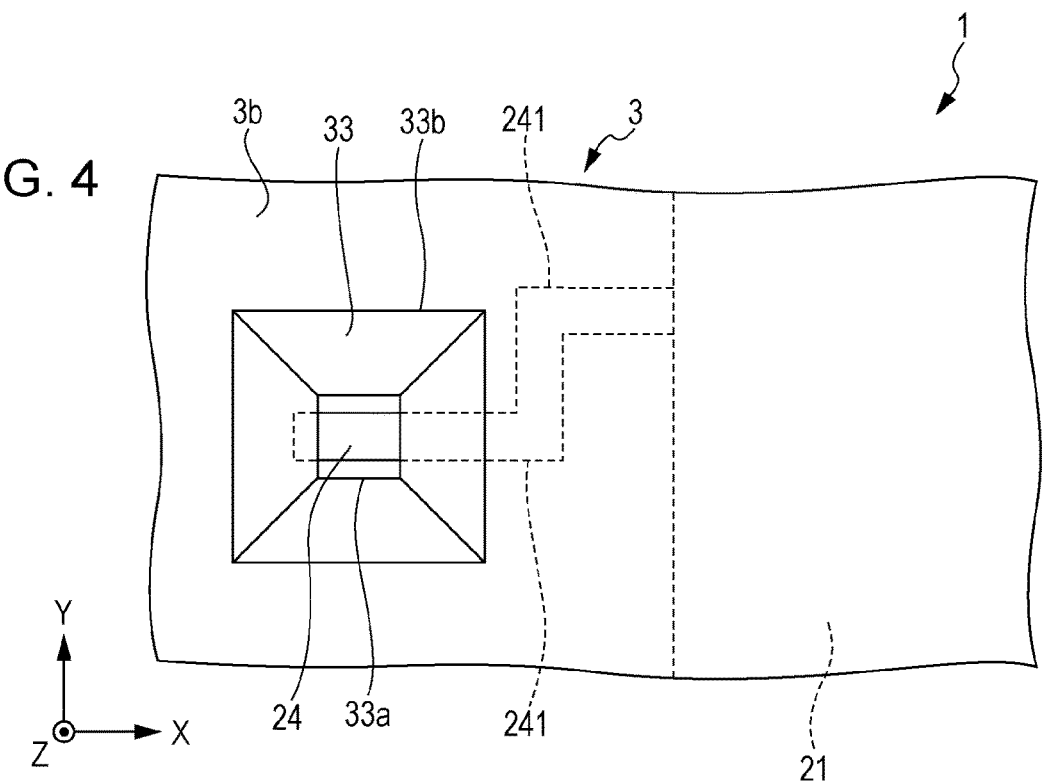
FIG. 4 is a planar view illustrating a groove which is included in a physical quantity sensor according to a second embodiment of the invention.
Figure 5:
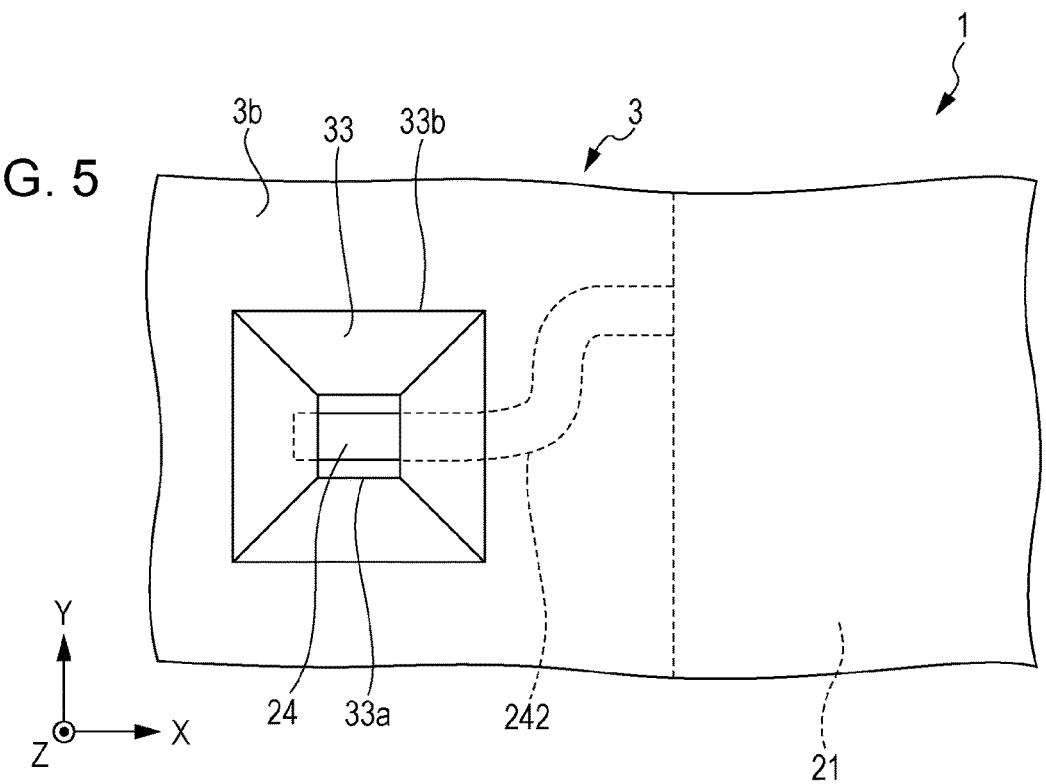
FIG. 5 is a planar view illustrating a modification example of the groove which is illustrated in FIG. 4.

FIG. 4 is a planar view illustrating a groove which is included in the physical quantity sensor according to the second embodiment of the invention. FIG. 5 is a planar view illustrating a modification example of the groove which is illustrated in FIG. 4.

The physical quantity sensor according to the present embodiment is the same as the physical quantity sensor according to the first embodiment described above aside from the form of the groove, which is provided on the substrate, being different.

Here, the description below relates to the physical quantity sensor of the second embodiment, the description focuses on the differences to the embodiment described above, and similar matter is omitted from the description. In addition, the configurations in FIG. 4 and FIG. 5 which are the same as the embodiment described above are given the same reference numerals.

As shown in FIG. 4, the groove 24, which is included in the physical quantity sensor 1 of the present embodiment, has two bent sections 241 in the middle of the extension direction. By providing bent sections 241, it becomes difficult for splash, which is generated when the sealing material 9 is melted by laser irradiation, to infiltrate in the internal space S via the groove 24. Consequently, adhesion of metal splash to the functional element 4 is reduced, and it is possible to reduce functional decline of the functional element 4. Here, the number of bent sections 241 is not limited to two, and may be one, or may be three or more. In addition, even if a curved section 242 as shown in FIG. 5 is included in place of the bent section 241, it is possible to exhibit the same effects as the present embodiment.

It is possible for the same effects as those in the first embodiment described above to also be exhibited in the second embodiment.

Third Embodiment

Next, a third embodiment of a physical quantity sensor of the invention will be described.

Figure 6:
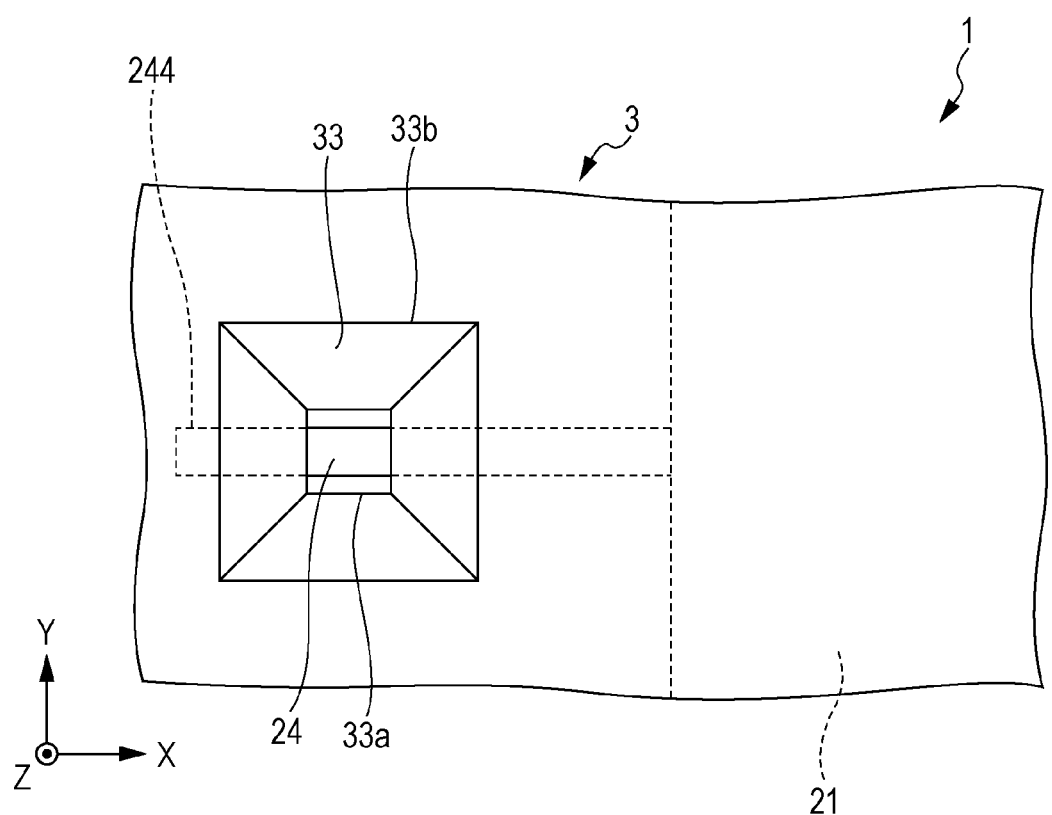
FIG. 6 is a planar view illustrating a groove included in a physical quantity sensor according to a third embodiment of the invention.

FIG. 6 is a planar view illustrating a groove which is included in a physical quantity sensor according to the third embodiment of the invention.

The physical quantity sensor according to the present embodiment is the same as the physical quantity sensor according to the first embodiment described above aside from the form of the groove, which is provided on the substrate, being different.

Here, the description below relates to the physical quantity sensor of the third embodiment, the description focuses on the differences to the embodiments described above, and similar matter is omitted from the description. In addition, the configuration in FIG. 6 which is the same as the embodiments described above is given the same reference numerals.

As shown in FIG. 6, the groove 24 which is included in the physical quantity sensor 1 of the present embodiment, is connected to the communication hole 33 in the middle of the extension direction. In other words, the groove 24 has a portion 244 which is connected to and extends from the communication hole 33 to the opposite side to the concave section 21. By setting such a configuration, it is possible for a portion of splash, which is generated when the sealing material 9 is melted by laser irradiation, to be allowed to infiltrate in the portion 244 on the opposite side to the concave section 21. For this reason, it becomes difficult for splash to infiltrate in the internal space S via the groove 24. Consequently, adhesion of metal splash to the functional element 4 is reduced, and it is possible to reduce functional decline of the functional element 4.

It is possible for the same effects as those in the first embodiment described above to also be exhibited in the third embodiment.

Fourth Embodiment

Next, a fourth embodiment of a physical quantity sensor of the invention will be described.

Figure 7:
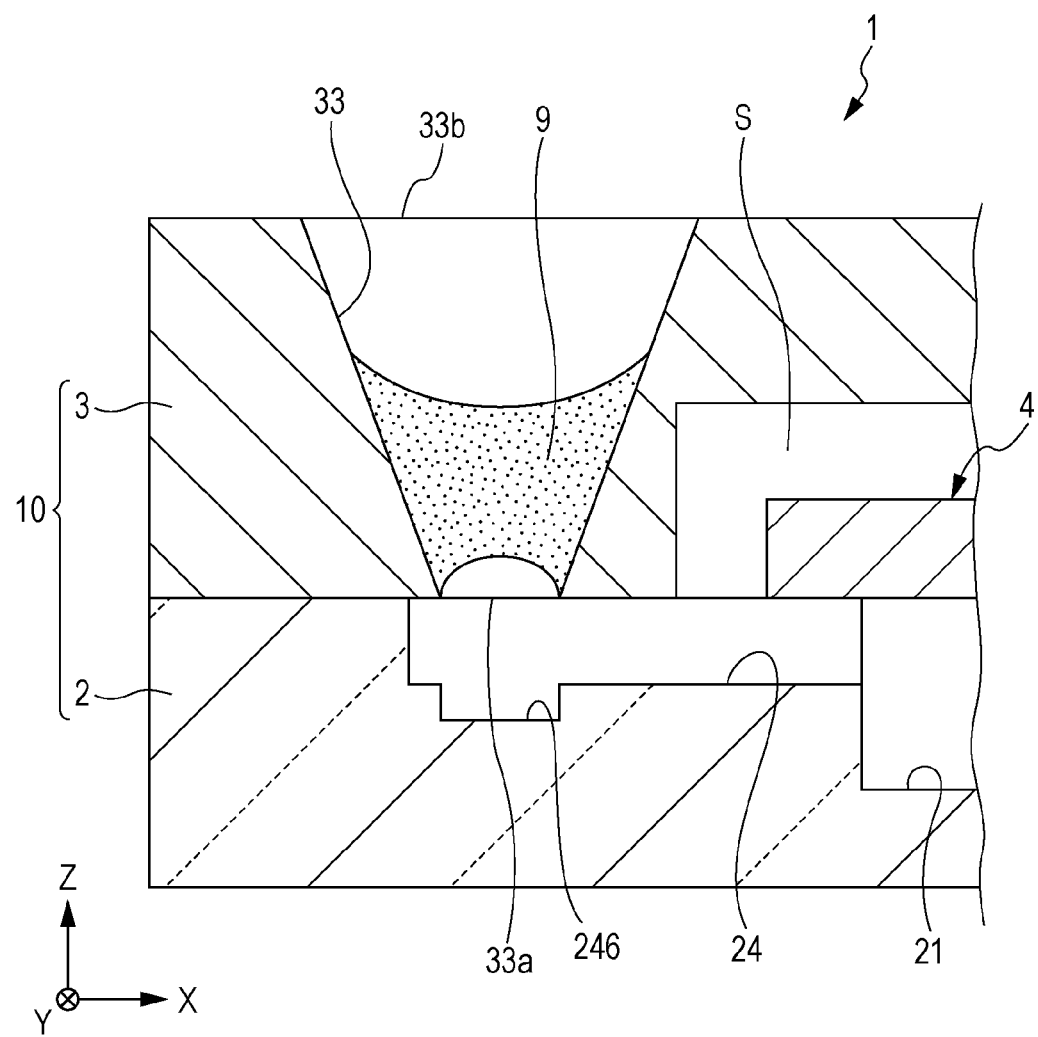
FIG. 7 is a sectional view illustrating a groove which is included in a physical quantity sensor according to a fourth embodiment of the invention.

FIG. 7 is a planar view illustrating a groove which is included in the physical quantity sensor according to the fourth embodiment of the invention.

The physical quantity sensor according to the present embodiment is the same as the physical quantity sensor according to the first embodiment described above aside from the form of the groove, which is provided on the substrate, being different.

Here, the description below relates to the physical quantity sensor of the fourth embodiment, the description focuses on the differences to the embodiments described above, and similar matter is omitted from the description. In addition, the configuration in FIG. 7 which is the same as the embodiments described above is given the same reference numerals.

As shown in FIG. 7, the groove 24, which is included in the physical quantity sensor 1 of the present embodiment, has a liquid reservoir section (concave section) 246 which is deeper than a portion other than a portion which corresponds to a connecting section of the communication hole 33 (a portion which faces the lower side opening 33a). By setting such a configuration, it is possible for at least a portion of splash, which is generated when the sealing material 9 is melted by laser irradiation, to be retained in the liquid reservoir section 246. For this reason, it becomes difficult for splash to infiltrate in the internal space S via the groove 24. Consequently, adhesion of metal splash to the functional element 4 is reduced, and it is possible to reduce functional decline of the functional element 4.

It is possible for the same effects as those in the first embodiment described above to also be exhibited in the fourth embodiment.

Fifth Embodiment

Next, a fifth embodiment of a physical quantity sensor of the invention will be described.

Figure 8:
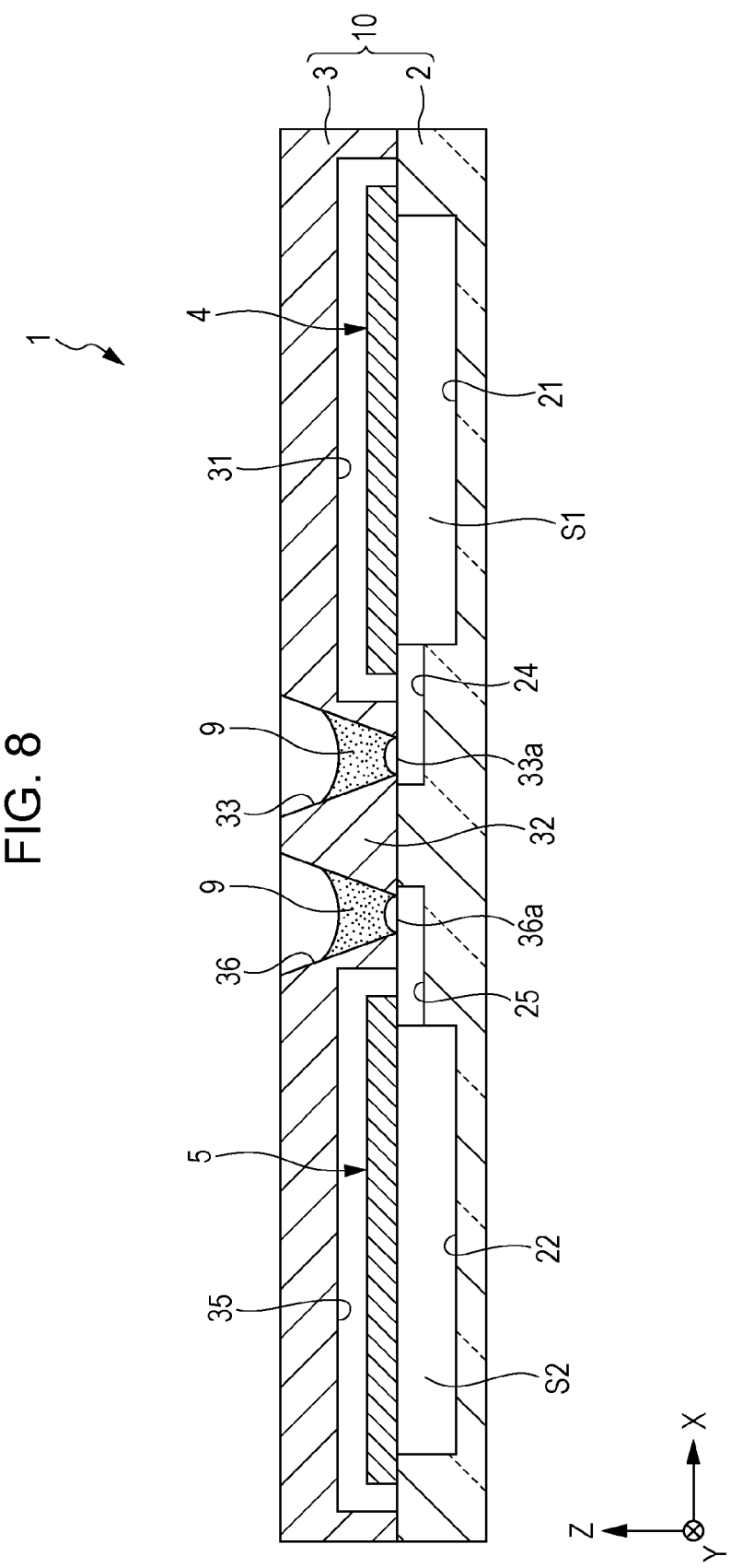
FIG. 8 is a sectional view illustrating a physical quantity sensor according to a fifth embodiment of the invention.
Figure 9:
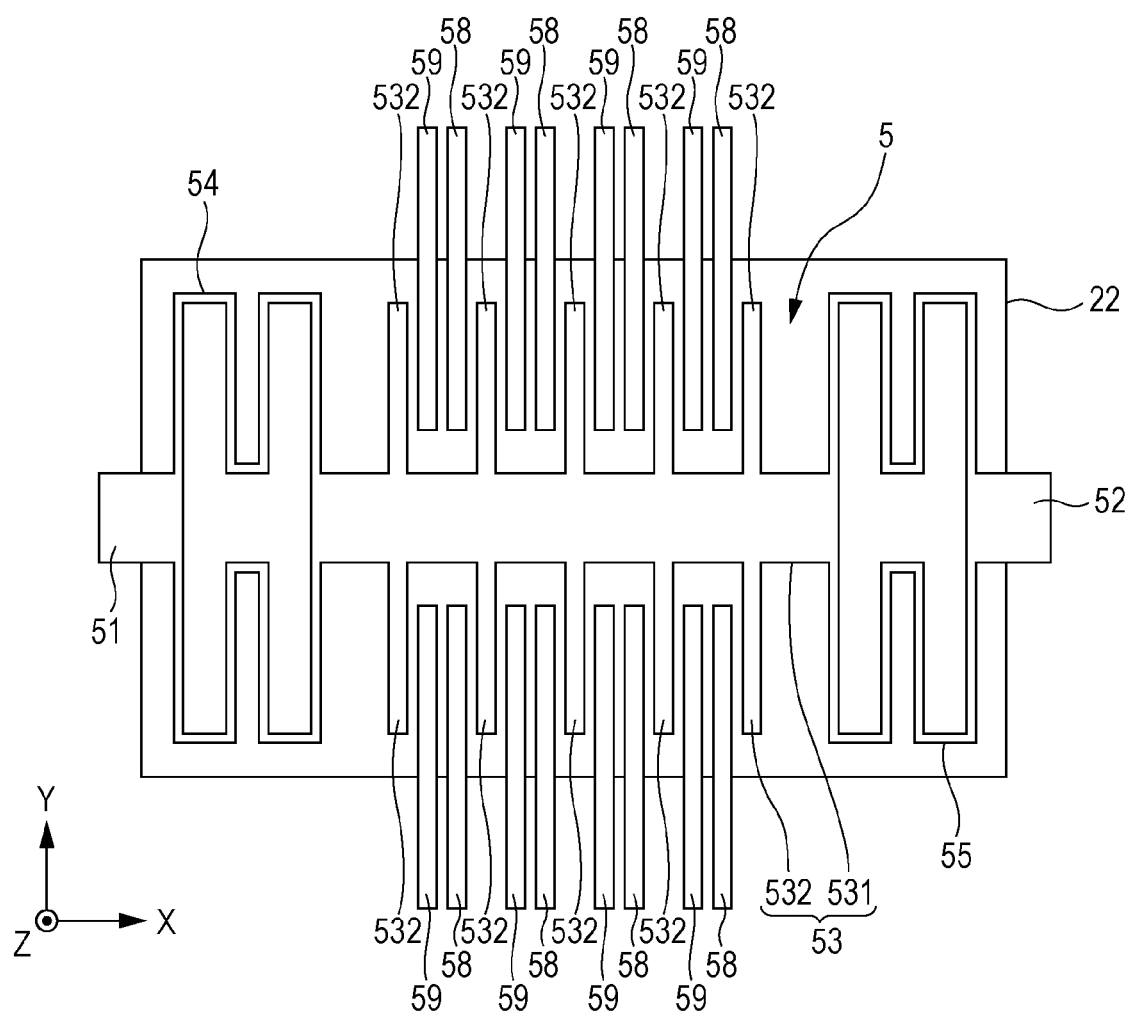
FIG. 9 is a planar view illustrating a second functional element which is included in the physical quantity sensor illustrated in FIG. 8.

FIG. 8 is a sectional view illustrating the physical quantity sensor according to the fifth embodiment of the invention. FIG. 9 is a planar view illustrating a second functional element which is included in the physical quantity sensor illustrated in FIG. 8.

The physical quantity sensor according to the present embodiment is the same as the physical quantity sensor according to the first embodiment described above aside from the number of functional elements being different.

Here, the description below relates to the physical quantity sensor of the fifth embodiment, the description focuses on the differences from the embodiments described above, and similar matter is omitted from the description. In addition, the configurations in FIG. 8 and FIG. 9 which are the same as the embodiments described above are given the same reference numerals.

The physical quantity sensor 1 of the present embodiment has the package 10, which is provided with the substrate 2 and the lid 3, and two functional elements 4 and 5 which are accommodated in the package 10.

Substrate 2

The substrate 2 has concave sections (first concave sections) 21 and 22 which are open at the upper surface. Out of the concave sections 21 and 22, the functional element (first functional element) 4 is disposed above the concave section 21, and the functional element 4 and the substrate 2 are prevented from coming into contact by the concave section 21. In addition, the functional element (second functional element) 5 is disposed above the concave section 22, and the functional element 5 and the substrate 2 are prevented from coming into contact by the concave section 22.

In addition, the groove (first groove) 24 which is open at the upper surface and is connected to the concave section 21 at one end section, and a groove (second groove) 25 which is connected to the concave section 22 at one end section are formed in the substrate 2. Out of the grooves 24 and 25, as will be described later, the groove 24 is a groove which causes the communication hole 33, which is formed in the lid 3, to communicate with an internal space (first cavity) S1, and, as will be described later, the groove 25 is a groove which causes a communication hole 36, which is formed in the lid 3, to communicate with an internal space (second cavity) S2. The grooves 24 and 25 are formed so as to be shallower than the concave sections 21 and 22. Here, since the configuration of the groove 25 is substantially the same as the groove 24, description thereof is omitted.

Lid 3

The lid 3 has concave sections (second concave sections) 31 and 35 which are open at the lower surface. Then, the lid 3 is joined to the substrate 2 so as to form the internal space S1 which accommodates the functional element 4 using the concave section 31 and the concave section 21, and the internal space S2 which accommodates the functional element 5 using the concave section 35 and the concave section 22. In addition, the lid 3 is formed in a partition wall section 32 which is positioned on the periphery of the concave sections 31 and 35 (internal spaces S1 and S2) in planar view, and has two communication holes 33 and 36 which cause the lower surface (first surface) 3a of the lid 3 to communicate with the upper surface (second surface) 3b of the lid 3, and do not directly communicate with the concave sections 31 and 35. Out of the communication holes 33 and 36, the communication hole 33 is positioned such that the lower side opening 33a thereof overlaps with the groove 24 of the substrate 2, and the communication hole 36 is positioned such that the lower side opening 36a thereof overlaps with the groove 25 of the substrate 2. For this reason, the communication hole 33 communicates with the internal space S1 via the groove 24, and the communication hole 36 communicates with the internal space S2 via the groove 25. Here, since the configuration of the communication hole 36 is substantially the same as the communication hole 33, description thereof is omitted.

The communication holes 33 and 36 are each sealed using the sealing material 9, and thereby, the internal spaces S1 and S2 are hermetically sealed. It is preferable that the internal space S1 come to be in a vacuum state (for example, a reduced pressure state of less than 10 Pa) in order to allow the functional element 4 to more effectively vibrate. Meanwhile, it is preferable that the internal space S2 come to be in a substantially atmospheric pressure state in order for a damping effect to be allowed to sufficiently be exhibited in the functional element 5. In addition, the inside of each of the internal spaces S1 and S2 may be substituted with an inert gas such as helium or argon.

Functional Element 5

The functional element 5 is an acceleration sensor element for detecting acceleration in the X axis direction. As shown in FIG. 9, such a functional element 5 has support sections 51 and 52, a movable section 53, connecting sections 54 and 55, a plurality of first fixed electrode fingers 58, and a plurality of second fixed electrode fingers 59. In addition, the movable section 53 has a base section 531, and a plurality of movable electrode fingers 532 which protrude from the base section 531 to both sides in the Y axis direction. Such a functional element 5 is, for example, formed from a silicon substrate which is doped with impurities such as phosphorus and boron.

The support sections 51 and 52 are joined to the upper surface of the substrate 2. Then, the movable section 53 is provided between the support sections 51 and 52. The movable section 53 communicates with the support section 51 via the connecting section 54, and communicates with the support section 52 via the connecting section 55. Thereby, the movable section 53 becomes displaceable in the X axis direction with respect to the support sections 51 and 52.

A plurality of the first fixed electrode fingers 58 are disposed on one side of the movable electrode fingers 532 in the X axis direction, and are lined up so as to have a comb-tooth form and mesh at intervals with respect to the corresponding movable electrode fingers 532. Such a plurality of the first fixed electrode fingers 58 are joined to the upper surface of the substrate 2 at the base end sections thereof.

In contrast to this, a plurality of second fixed electrode fingers 59 are disposed on the other side of the movable electrode fingers 532 in the X axis direction, and are lined up so as to have a comb-tooth form and mesh at intervals with respect to the corresponding movable electrode fingers 532. Such a plurality of the second fixed electrode fingers 59 are joined to the upper surface of the substrate 2 at the base end sections thereof.

Such a functional element 5 detects acceleration in the X axis direction as follows. That is, when acceleration is applied to the physical quantity sensor 1 in the X axis direction, the movable section 53 is displaced in the X axis direction while the connecting sections 54 and 55 are elastically deformed based on the level of the acceleration. Accompanying such displacement, an electrostatic capacity between the movable electrode fingers 532 and the first fixed electrode fingers 58, and an electrostatic capacity between the movable electrode fingers 532 and the second fixed electrode fingers 59 change respectively. For this reason, it is possible to detect acceleration based on the change (differential signals) of the electrostatic capacities.

According to the physical quantity sensor 1 with such a configuration, it is possible to utilize a compound sensor which is able to detect angular velocity and acceleration since the functional element includes the angular velocity sensor element and the acceleration sensor element. For this reason, it is possible to exhibit superior convenience. In addition, it is possible to place each of the functional elements 4 and 5 under an appropriate environment since it is possible for each of the internal spaces S1 and S2 to have different environments.

It is possible for the same effects as those in the first embodiment to also be exhibited in the fifth embodiment.

Electronic Device

Next, an electronic device of the invention will be described.

Figure 10:
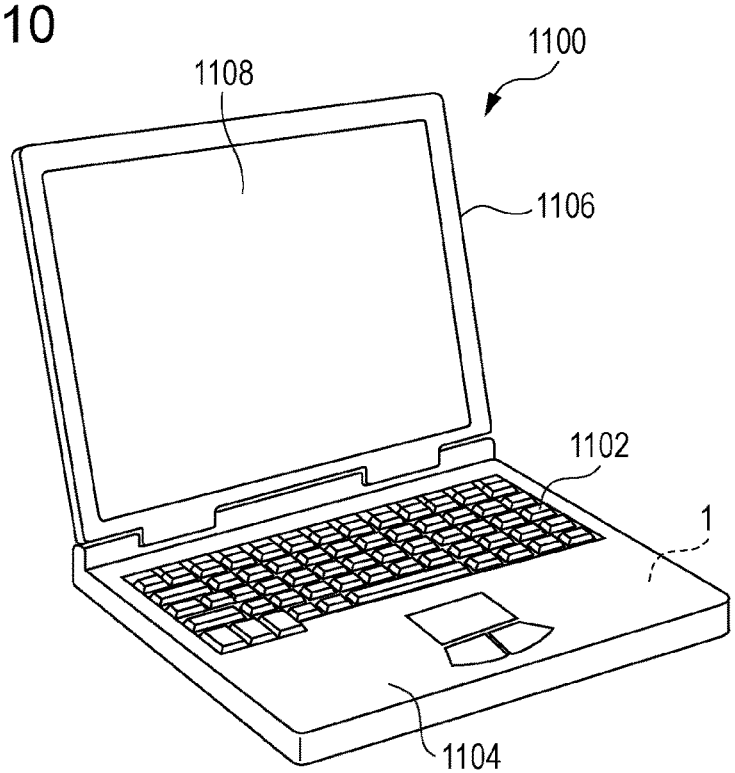
FIG. 10 is a perspective view illustrating a configuration of a mobile-type (or a notebook-type) personal computer to which an electronic device of the invention is applied.

FIG. 10 is a perspective view illustrating a configuration of a mobile-type (or a notebook-type) personal computer to which the electronic device of the invention is applied.

In the drawing, a personal computer 1100 is configured by a main body section 1104 which is provided with a keyboard 1102, and a display unit 1106 which is provided with a display section 1108, and the display unit 1106 is supported so as to be able to rotate via a hinge structure section with respect to the main body section 1104. The physical quantity sensor 1, which measures the physical quantity of acceleration, angular velocity, and the like in order to measure falling or inclination of such a personal computer 1100, is mounted in the personal computer 1100. In this manner, it is possible to obtain the personal computer 1100 exhibiting high reliability by mounting the physical quantity sensor 1 described above.

Figure 11:
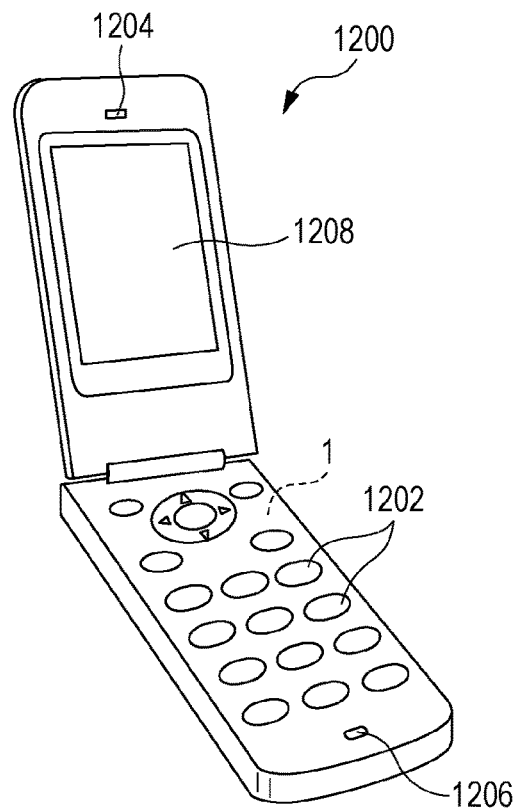
FIG. 11 is a perspective view illustrating a configuration of a mobile phone (also including PHS) to which the electronic device of the invention is applied.

FIG. 11 is a perspective view illustrating a configuration of a mobile phone (also including PHS) to which the electronic device of the invention is applied.

In the drawing, a mobile phone 1200 is provided with a plurality of operation buttons 1202, a receiving port 1204, and a transmission port 1206, and a display section 1208 is disposed between the operation buttons 1202 and the receiving port 1204. The physical quantity sensor 1, which measures the physical quantity of acceleration, angular velocity, and the like in order to measure falling or inclination of such a mobile phone 1200, is mounted in the mobile phone 1200. In this manner, it is possible to obtain the mobile phone 1200 exhibiting high reliability by mounting the physical quantity sensor 1 described above.

Figure 12:
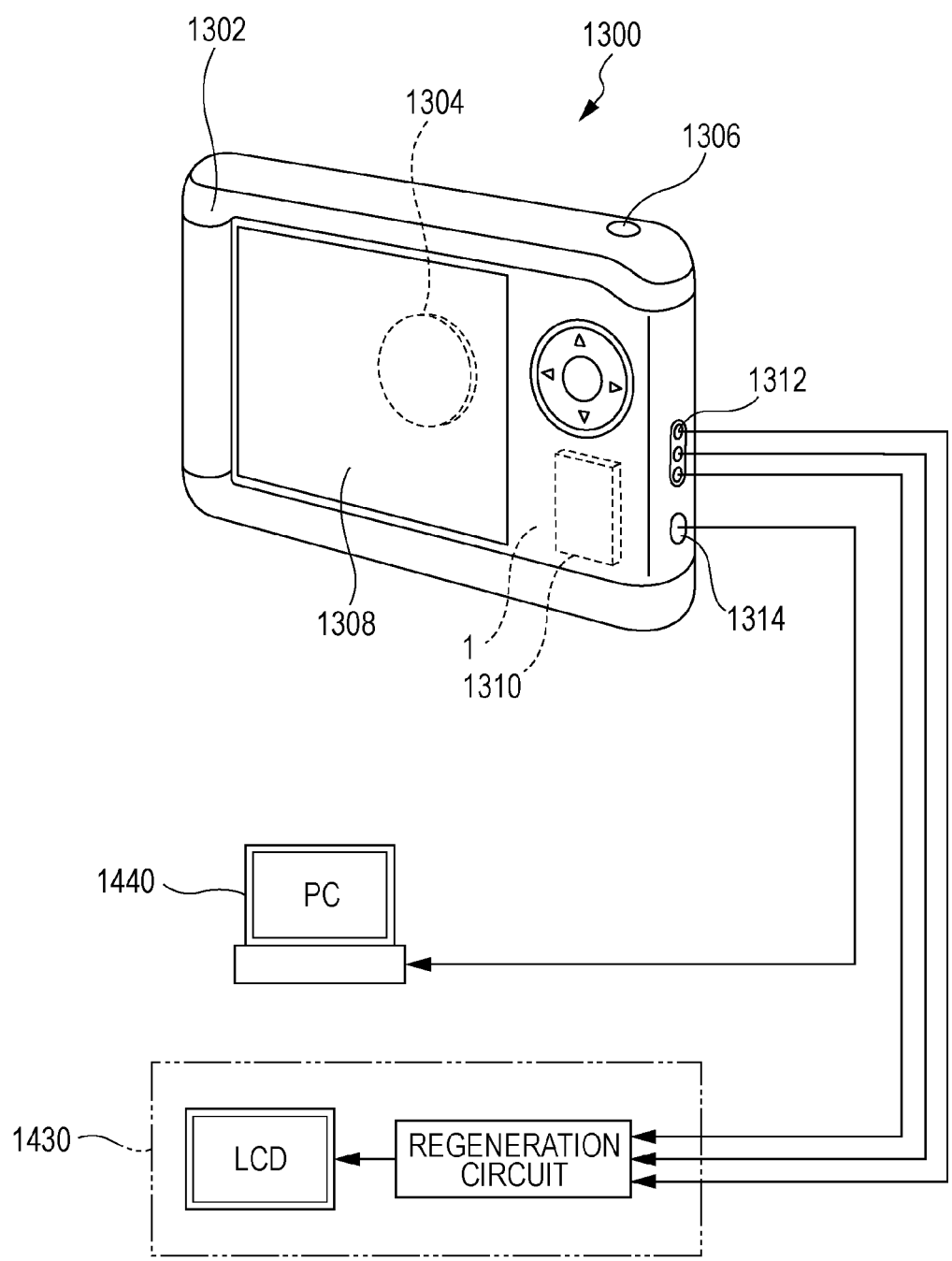
FIG. 12 is a perspective view illustrating a configuration of a digital still camera to which the electronic device of the invention is applied.

FIG. 12 is a perspective view illustrating a configuration of a digital still camera to which the electronic device of the invention is applied. Here, the drawing also illustrates the connection of an external device in a simplified manner.

The digital still camera 1300 generates an imaging signal (image signal) by photoelectric conversion of an optical image of a subject using an imaging element such as a charge coupled device (CCD). The display section 1308 is provided on the rear surface of a case (body) 1302 in the digital still camera 1300, and is configured to perform display based on the imaging signal using the CCD, and the display section 1308 functions as a viewfinder which displays a subject using an electronic image. In addition, a light-receiving unit 1304 which includes an optical lens (imaging optical system), CCD, and the like is provided at the front surface side (the rear surface side in the drawing) of the case 1302.

A subject image which is displayed on the display section 1308 is confirmed by a photographer, and a shutter button 1306 is pressed down, and the imaging signal of the CCD at the point in time is transferred and stored in a memory 1310. In addition, a video signal output terminal 1312 and an input and output terminal 1314 for data communication are provided on a side surface of the case 1302 in the digital still camera 1300. Then, as exemplified, a liquid crystal display 1430 is connected to the video signal output terminal 1312, or a personal computer 1440 is connected to the input and output terminal 1314 for data communication according to need. Furthermore, using a predetermined operation, the imaging signal which is stored in the memory 1310 is configured so as to be output to the liquid crystal display 1430 or the personal computer 1440. The physical quantity sensor 1, which measures the physical quantity of acceleration, angular velocity, and the like in order to measure falling or inclination of such a digital still camera 1300, is mounted in the digital still camera 1300. In this manner, it is possible to obtain the digital still camera 1300 exhibiting high reliability by mounting the physical quantity sensor 1 described above.

Here, in addition to the personal computer in FIG. 10, the mobile phone in FIG. 11, and the digital still camera in FIG. 12, it is also possible to apply the electronic device of the invention to, for example, a smartphone, an ink jet-type discharging apparatus (for example, an ink jet printer), a television, a video camera, a video tape recorder, a car navigation device, a pager, an electronic organizer (including those having a communication function), an electronic dictionary, an electronic calculator, an electronic game device, a word processor, a work station, a video phone, a television monitor for crime prevention, a pair of electronic binoculars, a POS terminal, medical equipment (for example, an electronic thermometer, a blood pressure meter, a blood glucose meter, an electrocardiographic measuring device, an ultrasonic diagnostic device, or an electronic endoscope), a fish finder, various measurement equipment, an instrument (for example, an instrument for a vehicle, an aircraft, or a ship), a flight simulator, and the like.

Mobile Body

Next, a mobile body of the invention will be described.

Figure 13:
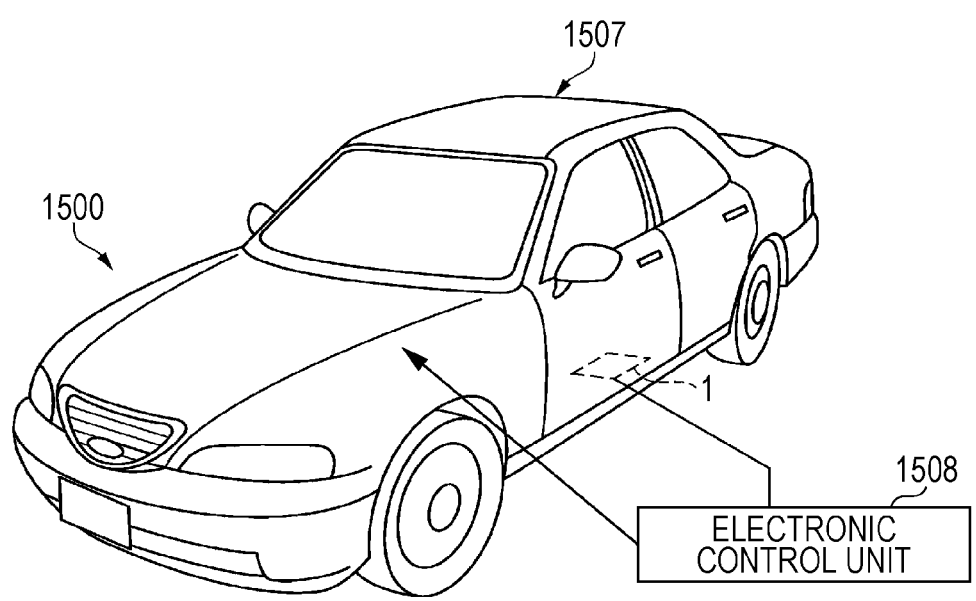
FIG. 13 is a perspective view schematically illustrating an automobile as an example of a mobile body of the invention.

FIG. 13 is a perspective view schematically illustrating an automobile as an example of the mobile body of the invention.

Various control units in which the physical quantity sensor 1, which processes various control signals, is provided are mounted in an automobile 1500. For example, as shown in FIG. 13, an electronic control unit (ECU) 1508 with a built-in sensor, which senses acceleration of the automobile 1500, and controls output from an engine is mounted on a vehicle body 1507 in the automobile 1500 as a mobile body. The physical quantity sensor 1, which measures the physical quantity of acceleration, angular velocity, and the like of the vehicle body 1507, is mounted in the electronic control unit 1508. In this manner, it is possible to execute appropriate engine output control with high precision according to the posture of the vehicle body 1507, and obtain the automobile 1500 as an effective mobile body in which consumption of fuel and the like is suppressed by mounting the physical quantity sensor 1 described above.

In addition, it is also possible to widely apply the physical quantity sensor 1 to a vehicle body posture control unit, a keyless entry system, an immobilizer, a car navigation system, car air conditioning, an anti-lock brake system (ABS), an airbag, a tire pressure monitoring system (TPMS), and the like.

The physical quantity sensor, the electronic device, and the mobile body of the invention are described above based on the embodiments of the drawings, but the invention is not limited thereto, and it is possible for the configuration of each section to be substituted with an arbitrary configuration which has the same function. In addition, other arbitrary constructions may be added to the invention.

In addition, in the embodiment described above, a configuration in which the physical quantity sensor has one or two functional elements is described, but the number of functional elements is not limited thereto, and there may be three or more. In addition, the detection axis of the angular velocity sensor and the acceleration sensor as the functional element is not particularly limited.

The entire disclosure of Japanese Patent Application No. 2014-172675, filed Aug. 27, 2014 is expressly incorporated by reference herein.

What is claimed is:

1. A physical quantity sensor comprising:
   a substrate having a first concavity and a substrate ledge, the substrate ledge being provided at a periphery of the substrate;
   a lid having a second concavity facing the first concavity, the lid having a lid ledge at a periphery of the lid, the lid ledge being fixed to the substrate ledge;
   a cavity which is from configured by the first concavity and the second concavity;
   a functional element which is accommodated in the cavity;
   a communication through hole which is formed in the lid ledge, the communication through hole being spaced apart from the first and second concavities in a plan view; and
   a groove which is formed in the substrate ledge and communicates with the first concavity, the groove extending along a top substrate surface of the substrate ledge from the communication through hole to an edge of the first concavity,
   wherein the communication through hole spatially communicates with the cavity via the groove.

2. The physical quantity sensor according to claim 1, wherein a sealing material is disposed inside the communication through hole so that the cavity is sealed from outside atmosphere.

3. The physical quantity sensor according to claim 1,
wherein the lid ledge has a lid ledge top surface and a lid ledge bottom surface, the lid ledge top surface is closer to a bottom of the second concavity than the lid ledge bottom surface, and
an inner surface of the communication through hole inclines from the lid ledge top surface toward the lid ledge bottom surface with respect to a normal line of the lid ledge bottom surface.

4. The physical quantity sensor according to claim 1,
wherein an overlapping substrate ledge area of the substrate ledge overlaps the second concavity in the plan view, and
the groove is formed in an area located outside of the overlapping substrate ledge area in the plan view.

5. The physical quantity sensor according to claim 4,
wherein the groove is formed in the overlapping substrate ledge area.

6. The physical quantity sensor according to claim 4,
wherein the groove is open at the lid ledge top surface.

7. The physical quantity sensor according to claim 4,
wherein a depth of the groove is shallower than a depth of the first concavity.

8. The physical quantity sensor according to claim 1,
wherein the lid ledge has a lid ledge top surface and a lid ledge bottom surface, the lid ledge top surface is closer to a bottom of the second concavity than the lid ledge bottom surface, and
a width of the groove is wider than an opening of the communication through hole located on the lid ledge bottom surface.

9. The physical quantity sensor according to claim 1,
wherein the groove includes one of a bent section and a curved section between the communication through hole and the cavity in the plan view.

10. The physical quantity sensor according to claim 1,
wherein a position in the groove spaced apart from an edge of the groove is connected to the communication through hole.

11. The physical quantity sensor according to claim 1,
wherein the groove is a liquid reservoir.

12. A physical quantity sensor comprising:
a substrate having a first concavity, a second concavity, a substrate center ledge, and a substrate peripheral ledge, the substrate center ledge being provided between the first and second concavities in a plan view, the substrate peripheral ledge being provided at a periphery of the substrate;
a lid having a third concavity facing the first concavity, the lid having a fourth concavity facing the second concavity, the lid having a lid center ledge provided between the third and fourth concavities in the plan view, the lid having a lid peripheral ledge at a periphery of the lid, the lid peripheral ledge being fixed to the substrate peripheral ledge;
a first cavity which is configured by the first concavity and the third concavity;
a second cavity which is configured by the second concavity and the fourth concavity;
a first functional element which is accommodated in the first cavity;
a second functional element which is accommodated in the second cavity;
a first communication through hole which is formed in the lid center ledge, the first communication through hole being spaced apart from the first, second, third, and fourth concavities in the plan view;
a second communication through hole which is formed next to the first communication through hole in the lid center ledge, the second communication through hole being spaced apart from the first, second, third, and fourth concavities in the plan view;
a first groove which is formed in the substrate center ledge and communicates with the first concavity, the first groove extending along a top substrate surface of the substrate center ledge from the first communication through hole to an edge of the first concavity; and
a second groove which is formed in the substrate center ledge and communicates with the second concavity, the second groove extending along the top substrate surface of the substrate center ledge from the second communication through hole to an edge of the second concavity,
wherein the lid center ledge is fixed to the substrate center ledge so as to become a partition wall between the first and second cavities, and
the first and second communication through holes spatially communicate with the first and second cavities via the first and second grooves, respectively.

13. The physical quantity sensor according to claim 12,
wherein the first functional element is an acceleration detection element, and
the second functional element is an angular velocity detection element.

14. An electronic device comprising:
the physical quantity sensor according to claim 1; and
a display that displays an image,
wherein the physical quantity sensor is configured to detect a physical quantity of the electronic device.

15. An electronic device comprising:
the physical quantity sensor according to claim 2; and
a display that displays an image,
wherein the physical quantity sensor is configured to detect a physical quantity of the electronic device.

16. An electronic device comprising:
the physical quantity sensor according to claim 3; and
a display that displays an image,
wherein the physical quantity sensor is configured to detect a physical quantity of the electronic device.

17. An electronic device comprising:
the physical quantity sensor according to claim 4; and
a display that displays an image,
wherein the physical quantity sensor is configured to detect a physical quantity of the electronic device.

18. An electronic device comprising:
the physical quantity sensor according to claim 5; and
a display that displays an image,
wherein the physical quantity sensor is configured to detect a physical quantity of the electronic device.

19. An electronic device comprising:
the physical quantity sensor according to claim 6; and
a display that displays an image,
wherein the physical quantity sensor is configured to detect a physical quantity of the electronic device.

20. A mobile body comprising:
the physical quantity sensor according to claim 1; and
a movable housing that accommodates the physical quantity sensor,
wherein the physical quantity sensor is configured to detect a physical quantity of the mobile body.

* * * * *